(12) United States Patent
Hirano

(10) Patent No.: US 7,419,534 B2
(45) Date of Patent: Sep. 2, 2008

(54) COOLER USING FILTER WITH DEHUMIDIFYING FUNCTION

(75) Inventor: Katsuya Hirano, Tokyo (JP)

(73) Assignee: NEC Corporation, Tokyo (JP)

( * ) Notice: Subject to any disclaimer, the term of this patent is extended or adjusted under 35 U.S.C. 154(b) by 398 days.

(21) Appl. No.: 10/547,874

(22) PCT Filed: Mar. 4, 2004

(86) PCT No.: PCT/JP2004/002715

§ 371 (c)(1),
(2), (4) Date: Sep. 2, 2005

(87) PCT Pub. No.: WO2004/089052

PCT Pub. Date: Oct. 14, 2004

(65) Prior Publication Data

US 2006/0185515 A1    Aug. 24, 2006

(30) Foreign Application Priority Data

Mar. 5, 2003    (JP) .............................. 2003-058354

(51) Int. Cl.
 *H05K 7/20* (2006.01)
 *B01D 53/26* (2006.01)
(52) U.S. Cl. .......................... 96/111; 96/130; 55/385.4; 454/184; 165/119
(58) Field of Classification Search ................ 55/385.1, 55/385.4, 385.6, 467, 471; 95/10, 11, 117; 96/108, 111, 121, 126, 134, 135, 143, 147; 62/440, 457.9; 236/44 R, 44 C, 49.3; 454/184; 165/119, 222, 231

See application file for complete search history.

(56) References Cited

U.S. PATENT DOCUMENTS

| 2,414,642 | A | * | 1/1947 | Wright | 34/80 |
| 3,577,710 | A | * | 5/1971 | Feldman | 96/140 |
| 3,966,442 | A | * | 6/1976 | Waters | 96/132 |
| 5,230,466 | A | * | 7/1993 | Moriya et al. | 236/44 A |
| 5,230,719 | A | * | 7/1993 | Berner et al. | 96/144 |
| 5,799,728 | A | * | 9/1998 | Blume | 165/231 |
| 5,934,368 | A | * | 8/1999 | Tanaka et al. | 165/233 |
| 6,161,765 | A | * | 12/2000 | Kay et al. | 236/49.3 |

(Continued)

FOREIGN PATENT DOCUMENTS

JP    60-113429    7/1985

(Continued)

*Primary Examiner*—Frank M Lawrence
(74) *Attorney, Agent, or Firm*—Scully, Scott, Murphy & Presser, P.C.

(57) ABSTRACT

A cooling apparatus is disclosed for cooling and dehumidifying the inside of a device such as an electronic device installed outdoors The cooling apparatus of the invention comprises a set of dehumidifying parts, each arranged at an open air intake side and an air exhaust side of a housing of the device respectively, and having filtering members for removing humidity from the open air. When air in the housing is saturated with humidity by air blowing from a fan, the rotational direction of the fan is reversed to thereby change the air flowing direction towards the dehumidification part. A dehumidification material thus receives heated and dried exhaust-air from a heating material and discharges moisture accumulated within the material to the outside, thereby recovering moisture absorption capability of the dehumidification material.

4 Claims, 2 Drawing Sheets

U.S. PATENT DOCUMENTS 6,749,405 B2 * 6/2004 Bassine ............ 417/313
6,772,534 B2 * 8/2004 Gomes et al. ............ 34/330

FOREIGN PATENT DOCUMENTS

| | | |
|---|---|---|
| JP | 2-54290 | 4/1990 |
| JP | 3-213121 | 9/1991 |
| JP | 4-294597 | 10/1992 |
| JP | 5-20387 | 3/1993 |
| JP | 7-8742 | 1/1995 |
| JP | 9-57044 | 3/1997 |

* cited by examiner

COOLER USING FILTER WITH DEHUMIDIFYING FUNCTION

TECHNICAL FIELD

The present invention relates to a cooling apparatus for cooling and dehumidifying the inside of a device such as electronic devices installed outdoors.

BACKGROUND ART

Conventionally, as an apparatus for cooling an electronic device installed outdoors, an air conditioner or a heat exchanger has been used. They provide the advantage of completely intercepting the open air before it can reach air inside the device, and the benefit of cooling the inside of the device with clean air. However, they have the disadvantage that they require power to drive an air conditioner. Furthermore, there exists a cooling apparatus for introducing open air in the device by using a filter as a filtering member. However, there is a problem with the apparatus in that the filter removes only dust and takes in the outside moisture directly into the device, thus corroding circuit components and the like that are mounted within the apparatus.

One of the prior arts that prevents dew condensation by reducing humidity within an electronic device is disclosed in Japanese patent literature JP-A-4-294597.

FIG. 1 shows a conventional cooling apparatus for electronic device described in the abovementioned patent literature. The conventional apparatus is connected to an electronic device and cools the inside of the electronic device to reduce humidity within the device by using a cooling fan.

As shown in FIG. 1, cooling apparatus for electronic device 32 comprises moisture absorption duct 34 at an air intake side of a body of the apparatus that cools heat generated by components within electronic device 31, absorption duct 34 being filled with reversible moisture absorbent 35 having a reversible characteristic for discharging absorbed moisture at a temperature above a predetermined temperature. Channel switching duct 36, blockage plate 37, and cooling fan 33 are provided at an air exhaust side of moisture absorption duct 34. Blockage plate 37 is designed to open and close synchronously with the turning on and off of a power source of electronic device 31.

When the power source of electronic device 31 is turned on, blockage plate 37 is opened and thus exhaust air channel L is opened, causing hot air due to the heat generated by the components in electronic device 31 to be attracted by the rotation of cooling fan 33. At this time, reversible moisture absorbent 35 is dried and regenerated at the temperature above the predetermined temperature. When the power source is turned off, exhaust air channel L is blocked by blockage plate 37, preventing the open air from entering electronic device 31, and causing reversible moisture absorbent 35 that has been regenerated and activated to absorb moisture from the residual air in the device. This results in the prevention of dew condensation in electronic device 31.

Despite the configuration wherein humidity within the electronic device is reduced to prevent dew condensation, the aforementioned conventional apparatus presents a problem that, since it utilizes the reversible moisture absorbent that is dried and regenerated at a temperature above the predetermined temperature, when the temperature within the electronic device does not exceed the predetermined temperature due to cooling, the reversible moisture absorbent cannot be dried and regenerated, and thus humidity increases. The repeated turning on and off of the power source for drying and regenerating the reversible moisture absorbent, this involving the most important operation for the device, causes a problem in the operability of the device, and necessitates frequent open/close operation of the blockage plate.

DISCLOSURE OF THE INVENTION

It is an object of the invention to provide a cooling apparatus that is capable of recovering a dehumidification capability of dehumidilification materials while preventing corrosion in the electronic device irrespective of whether the power source of the device is turned on or off.

To achieve the object, a cooling apparatus according to the invention comprises a set of dehumidification means placed at an open air intake side and an air exhaust side of a housing of the device respectively and having filtering members for removing humidity from the open air, and dehumidification-capability recovery means for recovering a dehumidification capability of the dehumidification means when air in the housing is saturated with humidity. A fan that blows the open air into the housing to cool a heating element is placed between the set of dehumidification means in the housing such that it faces the means.

When the air in the housing is saturated with humidity by the air flow from the fan, the rotational direction of the fan is reversed to change the air blowing direction towards the dehumidification means. Thus, a dehumidification material used as the dehumidification means receives heated and dried exhaust-air from the heating element and discharges the moisture accumulated within the material to the outside, thereby recovering moisture absorbing capability of the dehumidification material irrespective of whether the power source of the device is turned on or off. This obviates the need to replace the dehumidification material due to moisture absorption.

Moreover, by changing the air flow direction towards the dehumidification means and introducing clean open air from which dust and moisture are removed into the housing so that the inside of the housing is constantly cooled, power consumption in the present apparatus can be reduced compared with a heat exchanger or an air conditioner.

Since the open air is dehumidified when it is directly introduced in the apparatus in order to cool the device, the cooling apparatus of the invention also has an anticorrosion function.

BEST MODE FOR CARRYING OUT THE INVENTION

Figure 1:
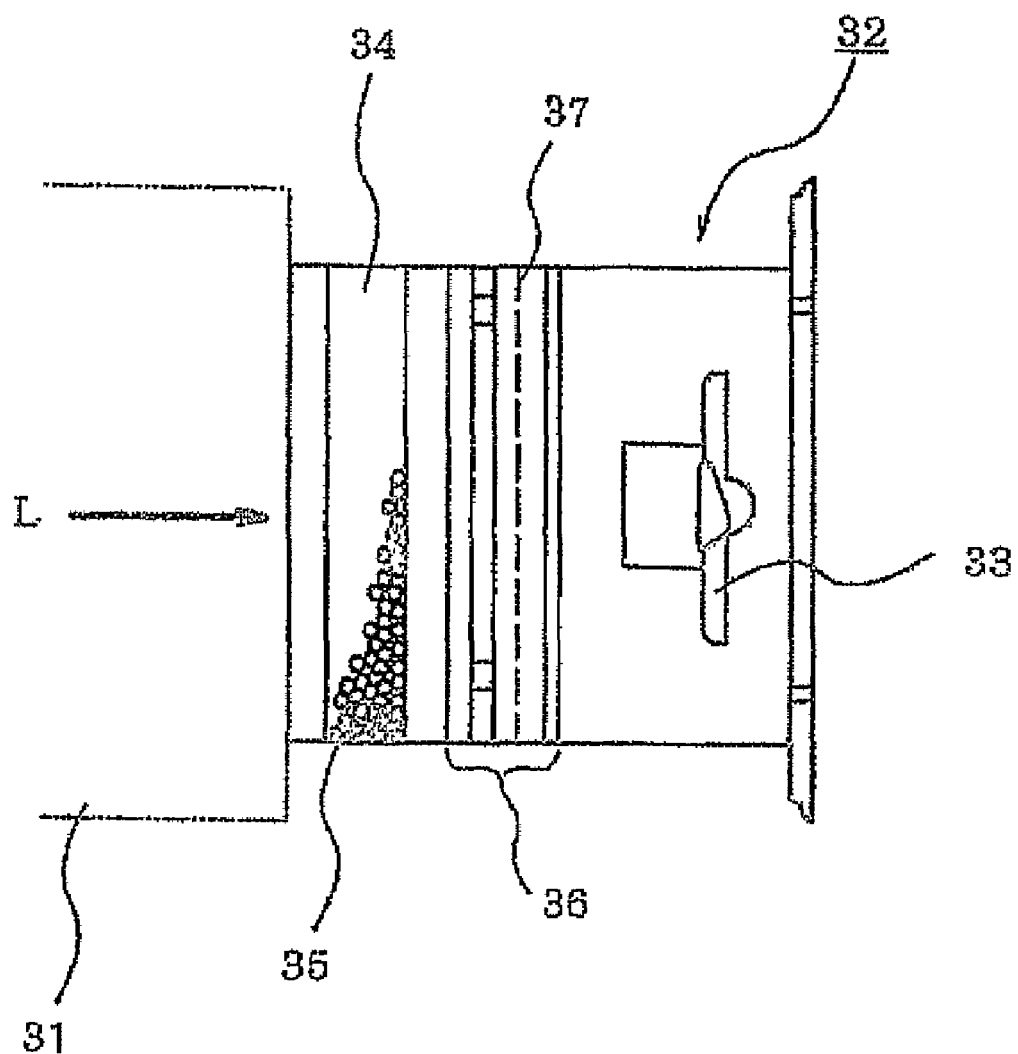
FIG. 1 is a front view showing a structure of a conventional cooling apparatus for electronic devices.
Figure 2:
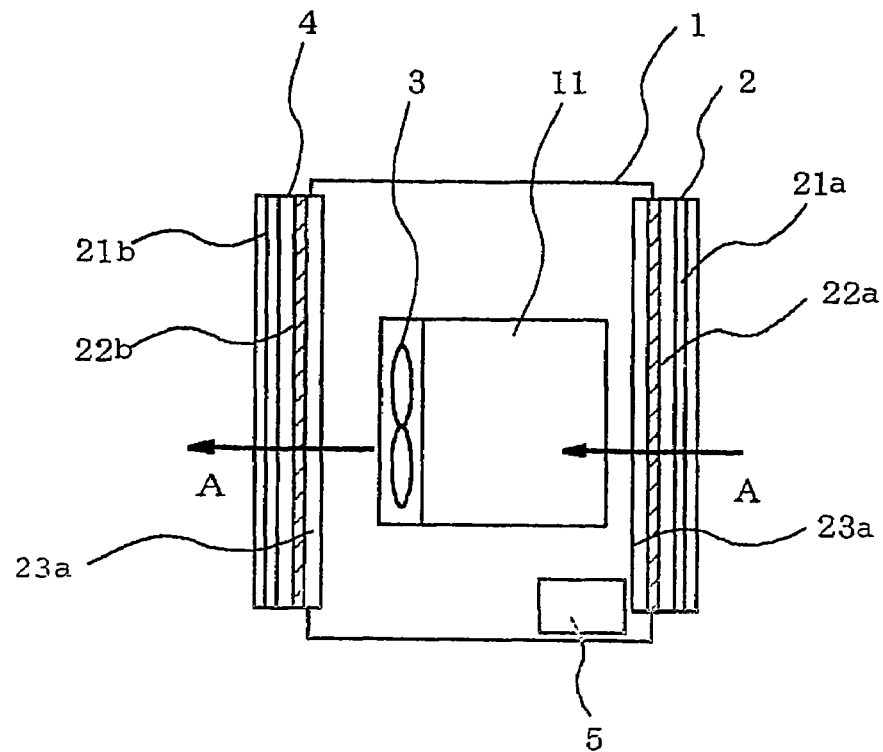
FIG. 2 is a cross section view showing a structure of a cooling apparatus for electronic devices according to an embodiment of the invention, and the air flow direction of the open air before moisture absorbing capability of a dehumidification material is saturated.

As illustrated in FIG. 2, a cooling apparatus for electronic devices according to an embodiment of the invention comprises filter 2, fan 3, filter 4, and controller 5.

Housing 1 is a cabinet of an electronic device installed outdoors. Mounted within housing 1 is sub rack 11 in which are mounted heating elements (not shown) in the electronic device, which need to be cooled. Filter 2 has a dehumidification function, and is provided on the front of housing 1 of the electronic device, i.e., at an open-air intake side. Filter 4 also has a dehumidification function, and is provided on the back of housing 1, i.e., at an air exhaust side, symmetrical to filter 2 with respect to housing 1. Mounted within filter 2 are filter materials 21a for removing dust and dehumidification materials 22a for removing humidity from the open air. Likewise, mounted within filter 4 are filter materials 21b for removing dust and dehumidification materials 22b for removing humidity from the open air. Filter materials 21a, 21b, and thus dehumidification materials 22a, 22b are symmetrically arranged with respect to housing 1. Humidity sensors 23a and 23b are provided inside of dehumidification materials 22a, 22b, respectively. A substance that discharges accumulated moisture to the outside at a temperature above the predetermined temperature, silica gel, for example, may be used for dehumidification materials 22a, 22b. Fan 3 is provided on the back of sub rack 11, and serves to blow the open air into the inside of the electronic device. By rotating fan 3 in the normal direction, the open air used for cooling is caused to pass through filter 2, sub rack 11, and filter 4 as shown by arrow A, radiating heat generated within housing 1 to the outside thereof (FIG. 2). Controller 5 controls the activation of fan 3 and the rotational direction thereof (normal direction/reverse direction) based on a signal from humidity sensors 23a, 23b.

Operation of the cooling apparatus for electronic devices of the embodiment will now be described.

The heating elements mounted within sub rack 11 of housing 1 generate heat through the operation of the electronic device. At this time, fan 3 is rotated in the normal direction, causing the open air used for cooling, from the outside of housing 1 to pass through filter material 21a of filter 2 at the front side as shown by arrow A, to remove dust, and further pass through dehumidification material 22a, thereby reducing humidity (FIG. 2). The clean air from which dust and humidity have been removed transports heat generated by the heating elements, and radiates the heat to the outside through filter 4 at the back side.

Figure 3:
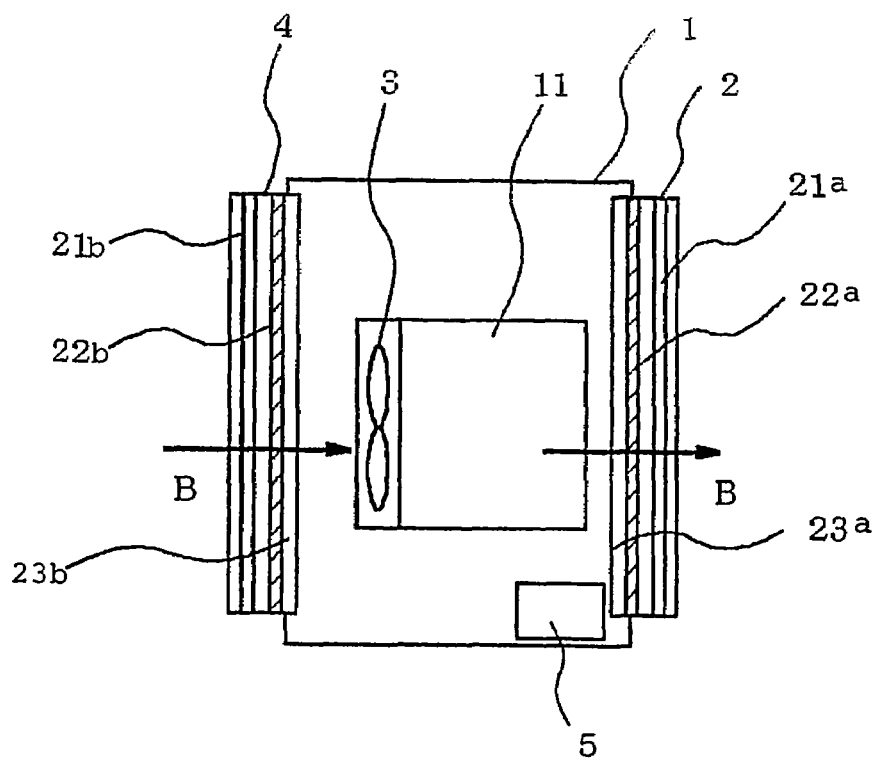
FIG. 3 is a cross section view showing a flow direction of the open air when the moisture absorbing capability of the dehumidification material is saturated, in the cooling apparatus for electronic devices of FIG. 1.

When dehumidification material 22a within filter 2 is saturated with moisture and loses its moisture absorbing capability because of the aforementioned repeated operation, the saturation is detected by humidity sensor 23a provided inside filter 2. When saturation is detected by humidity sensor 23a, fan 3 starts to rotate in the reverse direction through control of controller 5. As a result, open air taken in through filter 4 at the back side in a direction that is opposite to the direction when fan 3 is rotated in the normal direction, that is, as shown by arrow B, passes through filter material 21b and moisture absorbing material 22b to remove dust and humidity from the open air, and it further passes through sub rack 11 and filter 2, thereby maintaining a cooling capability (FIG. 3). At this time, saturated dehumidification material 22a at the side of filter 2 receives heated and dried exhaust-air in a direction of arrow B from sub rack 11 and therefore discharges the moisture accumulated within the material to the outside. As a result, the moisture absorbing capability of dehumidification material 22a is recovered.

When saturation of moisture absorbing material 22b at the side of filter 4 and hence loss of its moisture absorbing capability are detected by humidity sensor 23b during the reverse rotation of fan 3, fan 3 restarts to rotate in the normal direction through the control of controller 5, thus recovering the moisture absorbing capability of moisture absorbing material 22b at the side of filter 4 by air flowing in the direction of arrow A in FIG. 2.

Each time moisture absorbing material 22a in filter 2 or moisture absorbing material 22b in filter 4 is saturated with moisture, the operation of reversing the rotational direction of fan 3 to thereby recover the dehumidification capability of dehumidification materials 22a, 22b is subsequently repeated in the same manner. Dehumidification materials 22a, 22b thus automatically recover their dehumidification capability, which eliminates the need for replacing dehumidification materials 22a, 22b due to moisture absorption.

According to the present embodiment, dew condensation in electronic devices is prevented to thereby exhibit an anti-corrosion capability, and the cooling capability can be maintained on a semipermanent basis without replacing the dehumidification material.

While the present embodiment exemplifies a case in which an electronic device is installed outdoors, it should be noted that the invention is not limited thereto, and can be applied to other devices and apparatus that incorporate heating elements and are required to be cooled and dehumidified.

The invention claimed is:

1. A cooling apparatus using a filter having a dehumidification function comprising:
   a set of dehumidification means, each arranged at an open-air intake side and an air exhaust side of a housing that accommodates a heating element that requires cooling within the housing, said dehumidification means having filtering members for removing humidity from the open air,
   a fan placed between said set of dehumidification means such that it faces said means for introducing the open air in the housing, for cooling the heating element, and
   dehumidification-function recovery means for recovering the dehumidification capability of said dehumidification means when air in the housing is saturated with humidity, comprising a humidity sensor for detecting humidity of each of said dehumidification means and control means for reversing the rotational direction of said fan when said humidity sensor detects saturation of the air with humidity to change an air flow direction towards said set of dehumidification means.

2. The cooling apparatus according to claim 1, wherein the dehumidification means comprises silica gel.

3. The cooling apparatus according to claim 1, wherein the filtering members and dehumidification materials in said set of dehumidification means, are arranged symmetrically with respect to the housing.

4. An electronic device installed outdoors having the cooling apparatus according to claim 1.

* * * * *